(12) United States Patent
Song et al.

(10) Patent No.: US 11,563,290 B2
(45) Date of Patent: *Jan. 24, 2023

(54) BACKPLANE CONNECTOR WITH IMPROVED SHIELDING EFFECT

(71) Applicant: DONGGUAN LUXSHARE TECHNOLOGIES CO., LTD, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 91 days.

This patent is subject to a terminal disclaimer.

(21) Appl. No.: 17/334,195

(22) Filed: May 28, 2021

(65) Prior Publication Data
US 2021/0399485 A1 Dec. 23, 2021

(30) Foreign Application Priority Data

Jun. 19, 2020 (CN) .......................... 202010567796.4
Jul. 22, 2020 (CN) .......................... 202010710463.2

(51) Int. Cl.
*H01R 13/648* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS

| 4,601,527 | A | 7/1986 | Lemke |
| 5,664,968 | A | 9/1997 | Mickievicz |

(Continued)

FOREIGN PATENT DOCUMENTS

| CN | 1244959 A | 2/2000 |
| CN | 2513252 Y | 9/2002 |

(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of conductive terminals, an insulating frame, a first metal shield and a second metal shield. Each conductive terminal includes a connection portion and a contact portion. The conductive terminals include differential signal terminals, a first ground terminal and a second ground terminal. The first metal shield has a first elastic arm and a second elastic arm. The second metal shield has a third elastic arm and a fourth elastic arm. The first elastic arm and the third elastic arm are in contact with two opposite side surfaces of the contact portion of the first ground terminal. The second elastic arm and the fourth elastic arm are in contact with two opposite side surfaces of the contact portion of the second ground terminal. This arrangement increases the grounding shielding area, reduces crosstalk, and improves the quality of signal transmission.

10 Claims, 18 Drawing Sheets

(51) Int. Cl.

| | | |
|---|---|---|
| H01R 13/40 | (2006.01) | |
| H01R 13/6587 | (2011.01) | |
| H01R 13/6591 | (2011.01) | |
| H01R 13/514 | (2006.01) | |
| H01R 13/518 | (2006.01) | |
| H01R 12/72 | (2011.01) | |
| H01R 13/6586 | (2011.01) | |
| H01R 12/58 | (2011.01) | |
| H05K 1/11 | (2006.01) | |
| H01R 13/6588 | (2011.01) | |
| H01R 13/6583 | (2011.01) | |
| H01R 13/6585 | (2011.01) | |
| H01R 13/6582 | (2011.01) | |
| H01R 43/24 | (2006.01) | |
| H01R 12/71 | (2011.01) | |
| H01R 13/20 | (2006.01) | |
| H01R 13/504 | (2006.01) | |
| H01R 13/6461 | (2011.01) | |
| H01R 13/6584 | (2011.01) | |
| H01R 13/6474 | (2011.01) | |

(52) U.S. Cl.
CPC .......... *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
USPC ................................ 439/108, 701, 607.08
See application file for complete search history.

(56) References Cited

U.S. PATENT DOCUMENTS

| | | |
|---|---|---|
| 9,350,126 B2 | 5/2016 | Little et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | 201733225 A | 9/2017 |
| TW | I600231 B | 9/2017 |
| TW | I623154 B | 5/2018 |
| TW | 201841440 A | 11/2018 |

(56) References Cited

FOREIGN PATENT DOCUMENTS

| | | |
|---|---|---|
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

BACKPLANE CONNECTOR WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202010710463.2, filed on Jul. 22, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connectors usually include an insulating housing and a plurality of wafers assembled to the insulating housing. Each wafer includes an insulating frame, a plurality of conductive terminals insert-molded with the insulating frame, and a metal shield mounted to at least one side of the insulating frame. The conductive terminals usually include multiple pairs of differential signal terminals, a first ground terminal located on one side of each pair of differential signal terminals, and a second ground terminal located on the other side of each pair of differential signal terminals. The first ground terminal, the second ground terminal and the metal shield provide shielding for the differential signal terminals in order to reduce signal crosstalk and improve the quality of signal transmission.

However, with the continuous improvement of the signal transmission requirements of high-speed connectors, there is still room for improvement in the shielding of the differential signal terminals of the existing backplane connectors.

SUMMARY

An object of the present disclosure is to provide a backplane connector with improved shielding effect.

In order to achieve the above object, the present disclosure adopts the following technical solution: a backplane connector comprising a wafer, the wafer comprising: a plurality of conductive terminals, each of the conductive terminals comprising a connection portion and a contact portion; an insulating frame fixed with the connection portions of the conductive terminals; a first metal shield comprising a first extension portion; and a second metal shield comprising a second extension portion; wherein the conductive terminals comprise differential signal terminals, a first ground terminal and a second ground terminal, and the differential signal terminals are located between the first ground terminal and the second ground terminal; wherein the first metal shield comprises a first elastic arm and a second elastic arm located on opposite sides of the first extension portion, respectively; wherein the second metal shield comprises a third elastic arm and a fourth elastic arm located on opposite sides of the second extension portion, respectively; wherein the first elastic arm and the third elastic arm are in contact with opposite sides of the contact portion of the first ground terminal; and wherein the second elastic arm and the fourth elastic arm are in contact with opposite sides of the contact portion of the second ground terminal.

Compared with the prior art, the first metal shield and the second metal shield of the present disclosure respectively contact the contact portion of the first ground terminal and the contact portion of the second ground terminal from both sides, which increases the ground shielding area, reduces crosstalk and improves the quality of signal transmission.

DETAILED DESCRIPTION

Figure 1:
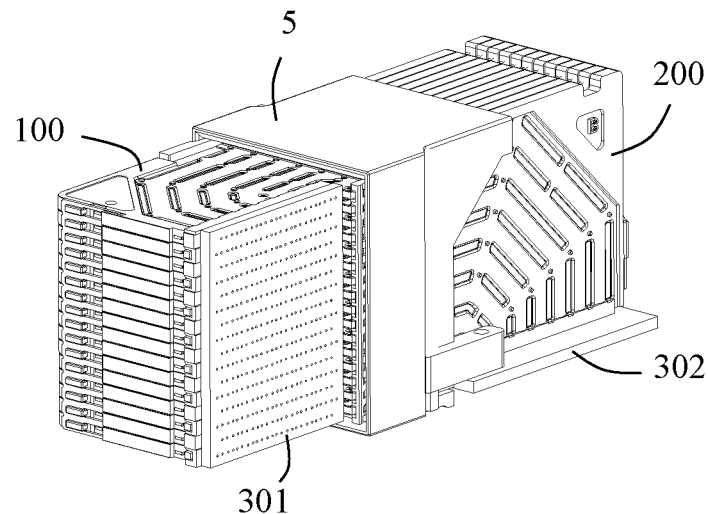
FIG. 1 is a perspective view of a backplane connector assembly having a first backplane connector mating with a second backplane connector in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
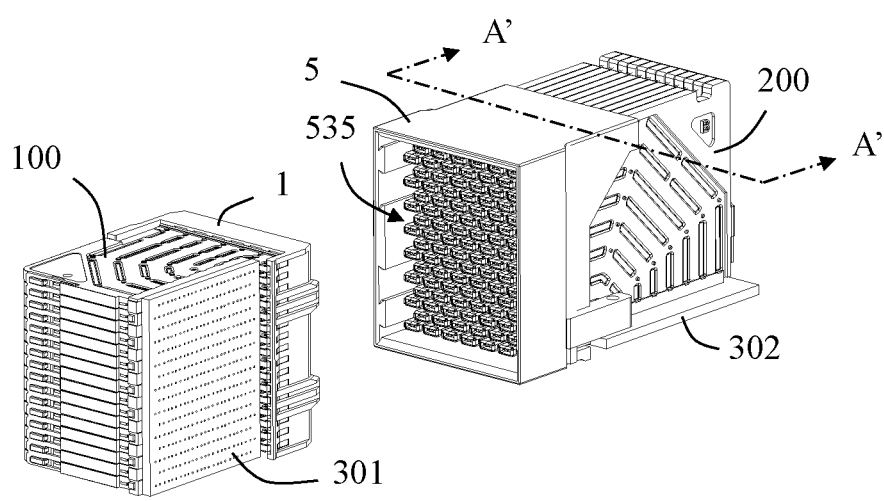
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
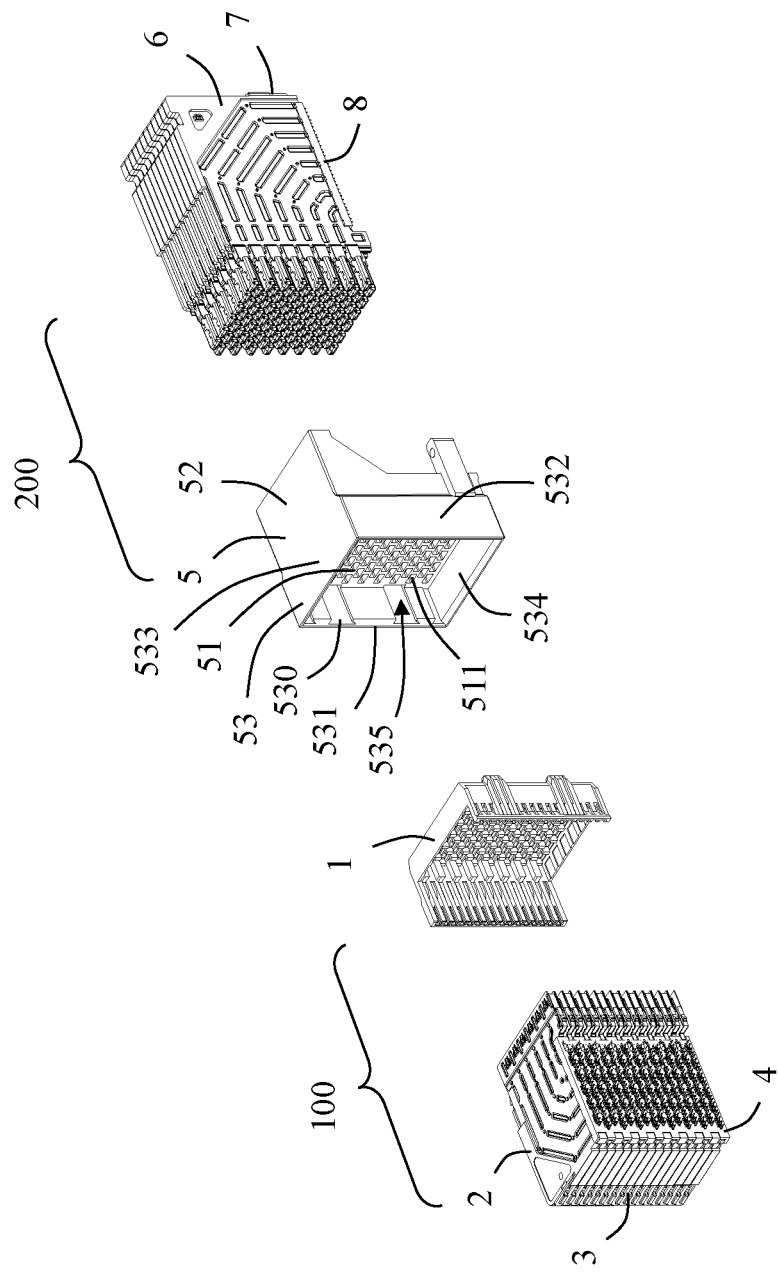
FIG. 3 is a further perspective exploded view of FIG. 2.
Figure 4:
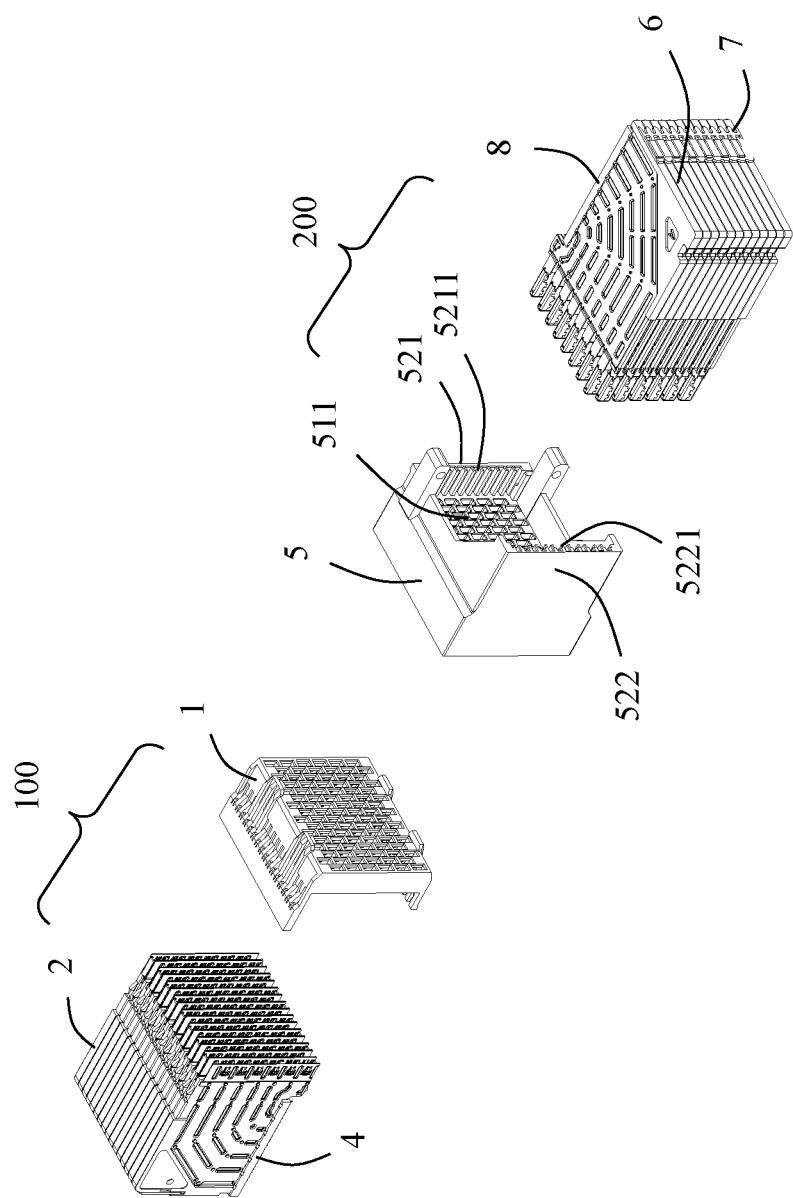
FIG. 4 is a perspective exploded view of FIG. 3 from another angle.
Figure 5:
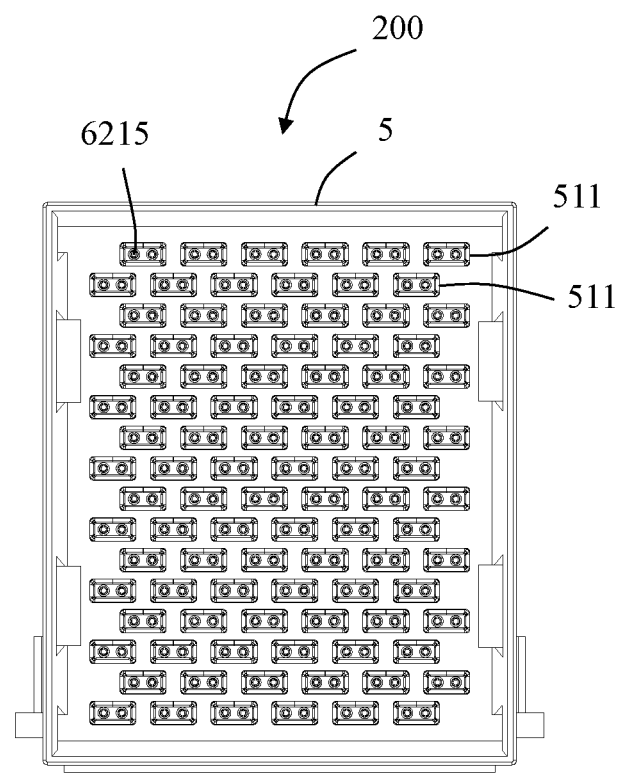
FIG. 5 is a front view of the second backplane connector in accordance with an embodiment of the present disclosure.

Referring to FIGS. 3 and 4, the first backplane connector 100 includes a header 1, a plurality of wafers 2 assembled to the header 1, a spacer 3 fixed at a rear end of the plurality of wafers 2, and a mounting block 4 mounted at a bottom end of the plurality of wafers 2.

Referring to FIGS. 3 to 6, the second backplane connector 200 includes a header 5, a plurality of wafers 6 assembled to the header 5, a spacer 7 holding on one side of the plurality of wafers 6, and a mounting block 8 holding the other side of the plurality of wafers 6.

The header 5 is made of insulating material. The header 5 includes a body portion 51, a wall portion 52 extending from the body portion 51 to one end, and a frame portion 53 extending from the body portion 51 to the other end. The body portion 51 includes a plurality of terminal receiving grooves 511 extending forwardly and rearwardly. In the illustrated embodiment of the present disclosure, the terminal receiving grooves 511 are disposed in multiple rows along a left-right direction. Two adjacent rows of terminal receiving grooves 511 are staggered in a vertical direction. That is, in two adjacent rows of the terminal receiving grooves 511, the terminal receiving grooves 511 at corresponding positions are not in alignment with each other in the left-right direction. The wall portion 52 includes a first wall portion 521 and a second wall portion 522 disposed opposite to each other. The first wall portion 521 includes a plurality of first slots 5211. The second wall portion 522 includes a plurality of second slots 5221. The first slot 5211 and the second slot 5221, which are in alignment with each other along the vertical direction, together with the second terminal receiving slot 511 corresponding to the first slot 5211 and the second slot 5221 are jointly used for receiving the same wafer 6.

The frame portion 53 includes a first extension wall 531, a second extension wall 532 opposite to the first extension wall 531, a top wall 533 connecting one end of the first extension wall 531 and one end of the second extension wall 532, a bottom wall 534 connecting the other end of the first extension wall 531 and the other end of the second extension wall 532, and a receiving space 535 jointly enclosed by the first extension wall 531, the second extension wall 532, the top wall 533 and the bottom wall 534. The receiving space 535 is used for at least partially accommodating the first backplane connector 100. Specifically, in the illustrated embodiment of the present disclosure, both the first extension wall 531 and the second extension wall 532 include a plurality of positioning grooves 530 disposed at intervals. The receiving space 535 is used for accommodating the header 1. The positioning grooves 530 are used for accommodating the corresponding positioning protrusions 14 so as to improve the mating accuracy of the first backplane connector 100 and the second backplane connector 200.

Figure 11:
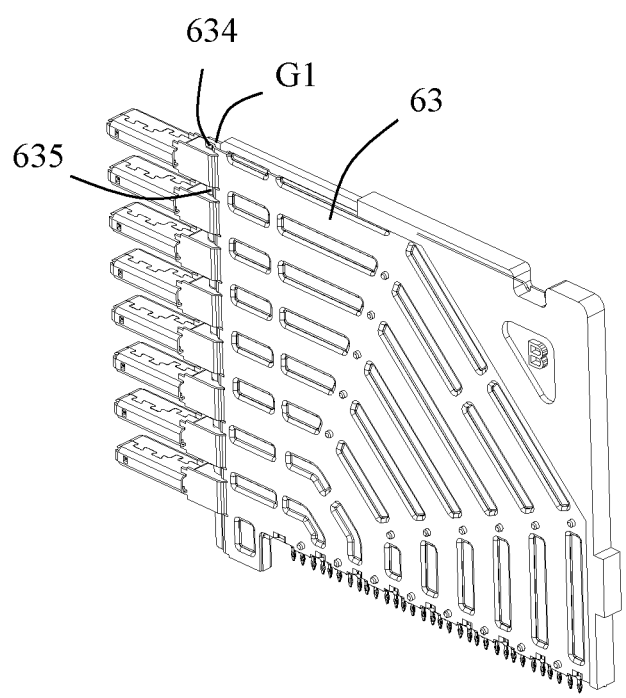
FIG. 11 is a perspective schematic view of a wafer of the second backplane connector.
Figure 12:
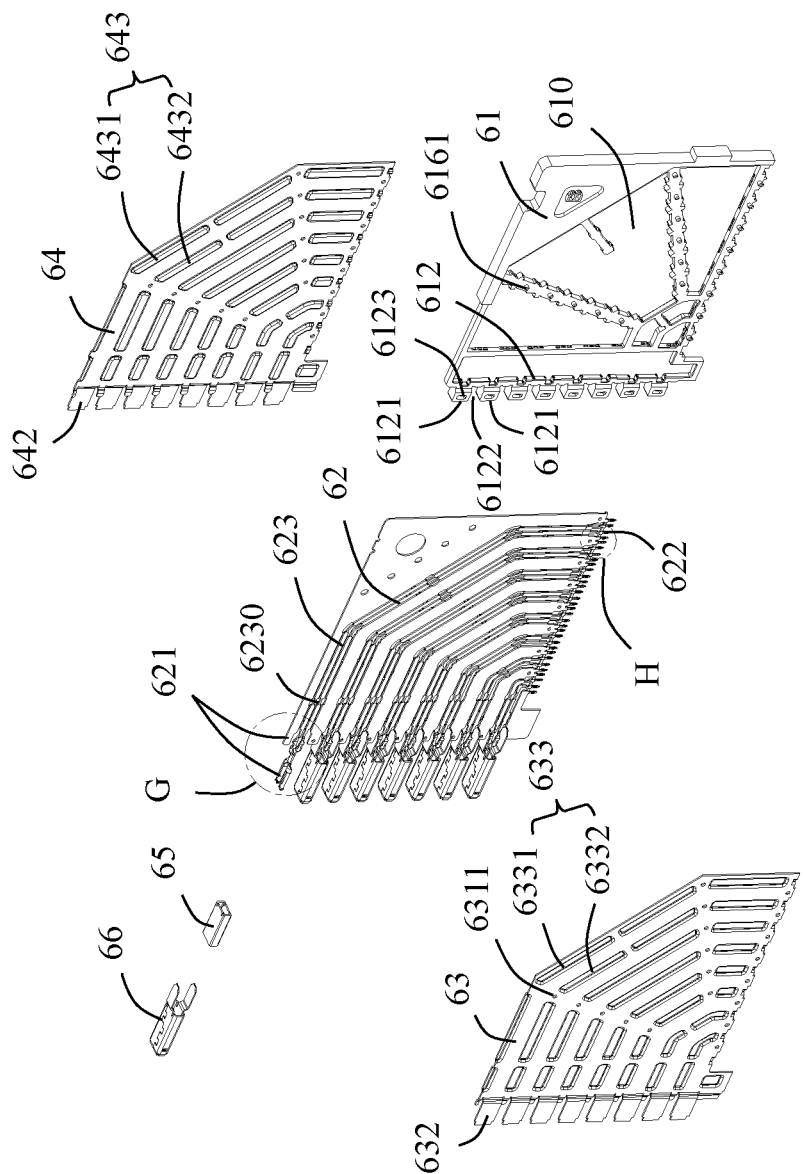
FIG. 12 is a partially exploded perspective view of FIG. 11.

Referring to FIGS. 11 and 12, each wafer 6 includes an insulating frame 61, a plurality of conductive terminals 62 insert-molded with the insulating frame 61, a first metal shield 63 fixed on one side of the insulating frame 61, and a second metal shield 64 fixed on the other side of the insulating frame 61.

Figure 19:
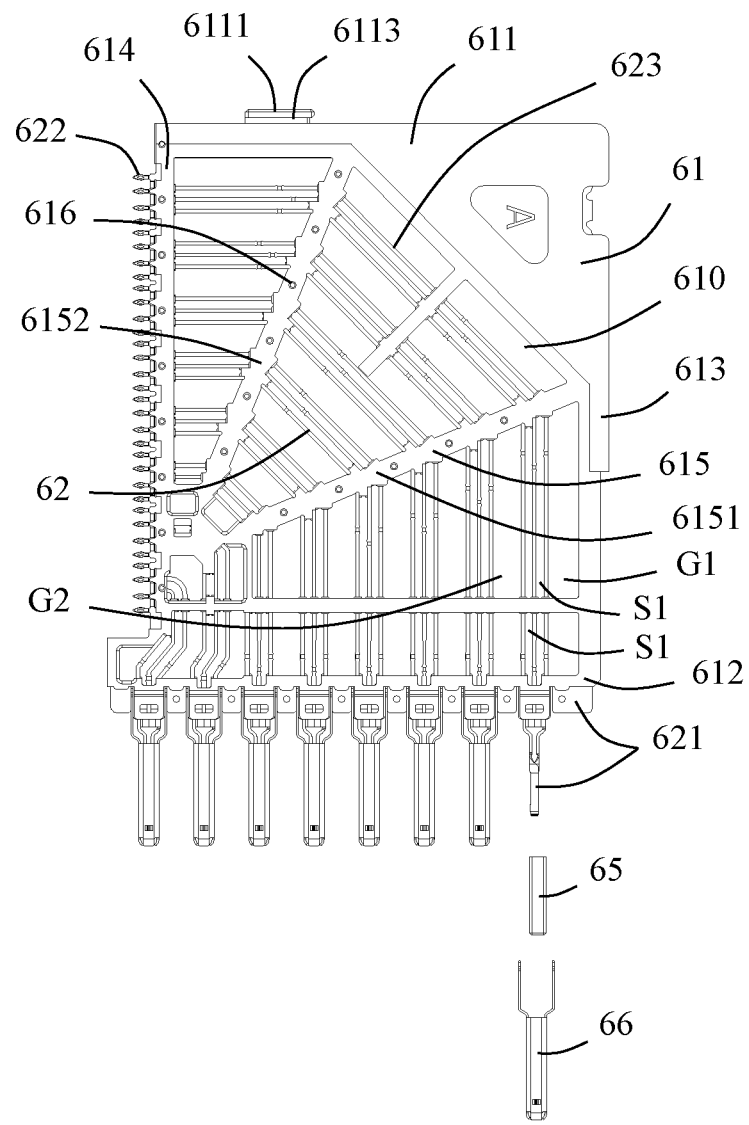
FIG. 19 is a plan view after removing the first metal shield and the second metal shield in FIG. 16.

Referring to FIGS. 12 and 19, the insulating frame 61 is roughly frame-shaped. The insulating frame 61 includes a rear wall 611, a front wall 612 opposite to the rear wall 611, a top wall 613 connecting one end of the rear wall 611 and one end of the front wall 612, a bottom wall 614 connecting the other end of the rear wall 611 and the other end of the front wall 612, and a plurality of connecting walls 615. The connecting walls 615 can enhance the structural strength of the frame. The rear wall 611 includes a first protrusion 6111. The first protrusion 6111 includes a first constriction portion 6113. In the illustrated embodiment of the present disclosure, the insulating frame 61 includes a hollow portion 610. The connecting walls 615 include a first connecting wall 6151 connecting the top wall 613 and the bottom wall 614, and a second connecting wall 6152 connecting the rear wall 611 and the bottom wall 614. The first connecting wall 6151 and the second connecting wall 6152 are exposed in the hollow portion 610.

Referring to FIG. 12, the front wall 612 includes a plurality of protruding blocks 6121 disposed at intervals and a groove 6122 located between two adjacent protruding blocks 6121. The protruding block 6121 includes an opening 6123 to partially expose corresponding conductive terminal 62 in order to adjust the impedance.

Figure 16:
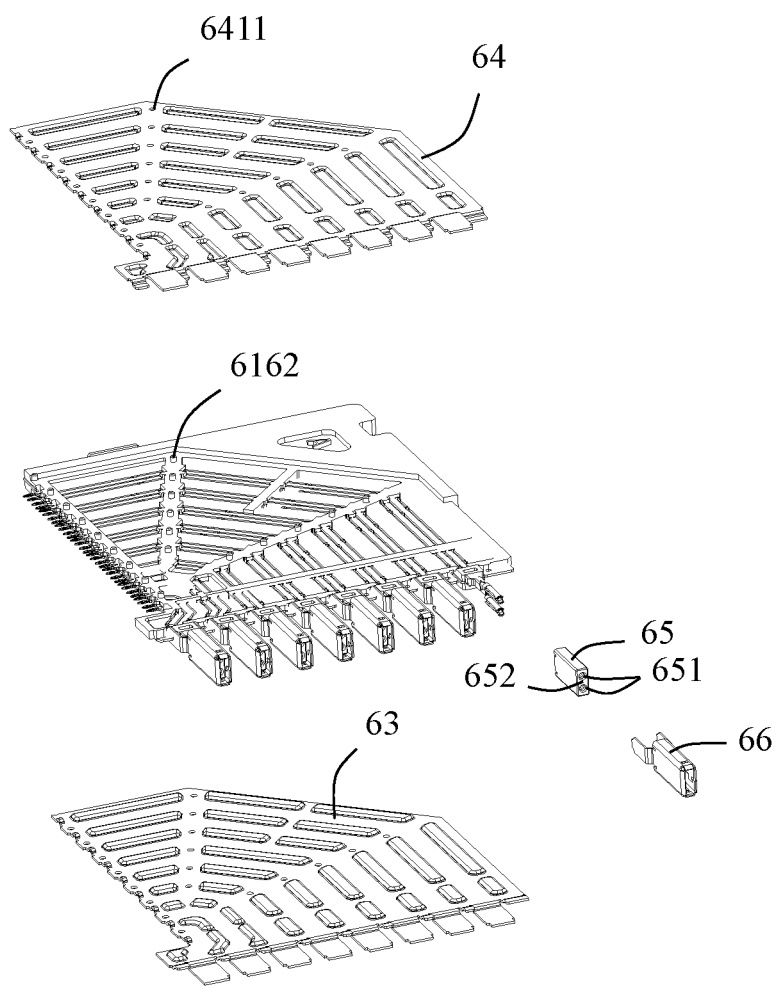
FIG. 16 is a partially exploded perspective view of FIG. 12 from another angle.
Figure 17:
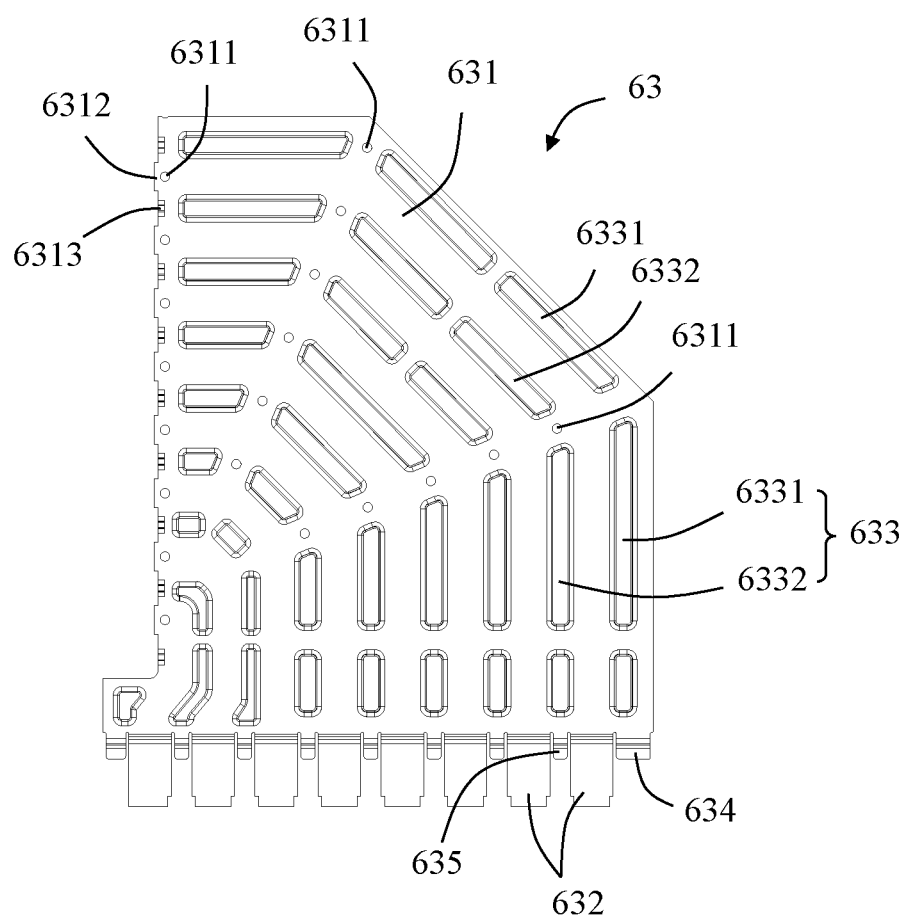
FIG. 17 is a side view of a first metal shield of the second backplane connector.

Referring to FIGS. 12 and 16, the insulating frame 61 further includes a plurality of posts 616 for fixing and positioning the first metal shield 63 and the second metal shield 64. In the illustrated embodiment of the present disclosure, the posts 616 are disposed on the bottom wall 614, the first connecting wall 6151 and the second connecting wall 6152. The first metal shield 63 and the second metal shield 64 are located on two sides of the insulating frame 61, respectively. The posts 616 include a plurality of first posts 6161 and a plurality of second posts 6162. The first posts 6161 and the second posts 6162 are located on opposite sides of the insulating frame 61 so to be fixed to the first metal shield 63 and the second metal shield 64, respectively.

Referring to FIG. 19, each conductive terminals 62 includes a contact portion 621, tail portion 622, and a connection portion 623 connecting the contact portion 621 and the tail portion 622. Some of the contact portions 621 are used to electrically connect with the first backplane connector 100. The tail portions 622 are used to be mounted to the second circuit board 302. In the illustrated embodiment of the present disclosure, the contact portion 621 is substantially perpendicular to the tail portion 622. The connection portion 623 is of a curved configuration.

Each group of conductive terminals 62 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 62 are disposed in a manner of G1-S1-S1-G2, which is beneficial to improve the quality of signal transmission. The differential signal terminals are narrow-side coupling or wide-side coupling. A width of the first ground terminal G1 and a width of the second ground terminal G2 are greater than a width of each signal terminal S1 therebetween, which is beneficial to increase the shielding area and improve the shielding effect.

Figure 14:
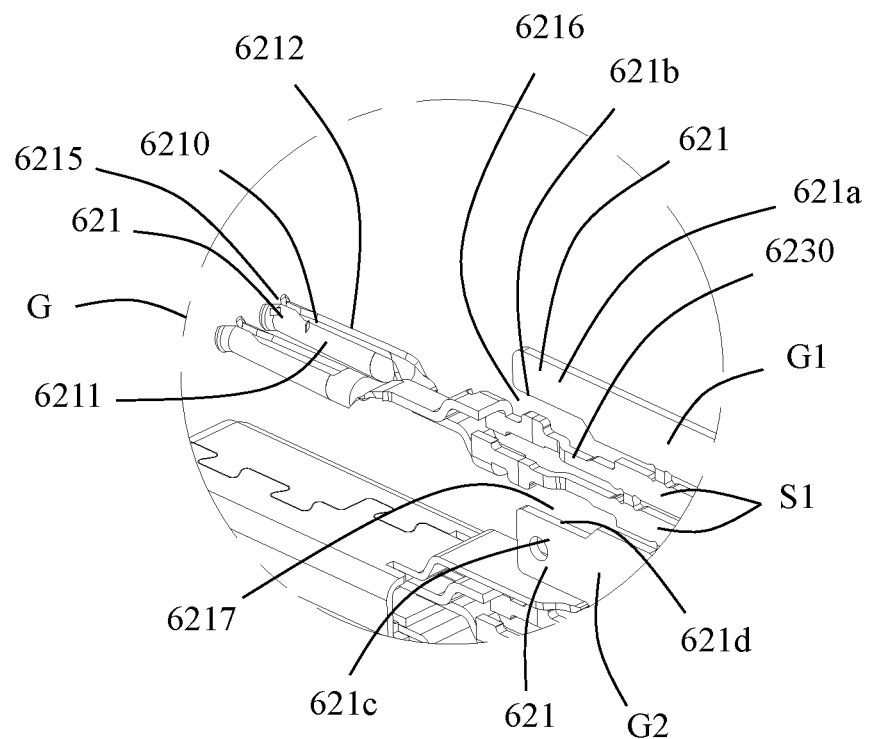
FIG. 14 is a partial enlarged view of a circled part G in FIG. 12.

In the illustrated embodiment of the present disclosure, the connection portions 623 of the conductive terminals 62 are partially insert-molded with the insulating frame 61. The connection portion 623 of the signal terminal S1 includes a narrowed portion 6230 insert-molded with the insulating frame 61 for adjusting the impedance of the signal terminal S1 in order to achieve impedance matching. Referring to FIG. 14, in the illustrated embodiment of the present disclosure, each contact portion 621 of the signal terminal S1 has a two-half structure, which includes a first contact section 6211, a second contact section 6212, and a slot 6210 located between the first contact section 6211 and the second contact section 6212. When the needle-shaped contact portion 221 of the signal terminal S1 of the first backplane connector 100 is inserted between the first contact section 6211 and the second contact section 6212, the first contact section 6211 and the second contact section 6212 can be elastically deformed in order to improve the contact reliability. The first contact section 6211 includes a first arc-shaped surface, and the second contact section 6212 includes a second arc-shaped surface. The first arc-shaped surface and the second arc-shaped surface are disposed opposite to each other so as to jointly form a mating hole 6215 for receiving the contact portion 221 of the signal terminal S1 of the first backplane connector 100. The two signal terminals S1 constituting a pair of differential signal terminals, their connection portions 623 are disposed in a first direction (for example, a vertical direction), and their contact portions 621 are disposed in a direction (for example, a left-right direction) perpendicular to the first direction.

Figure 15:
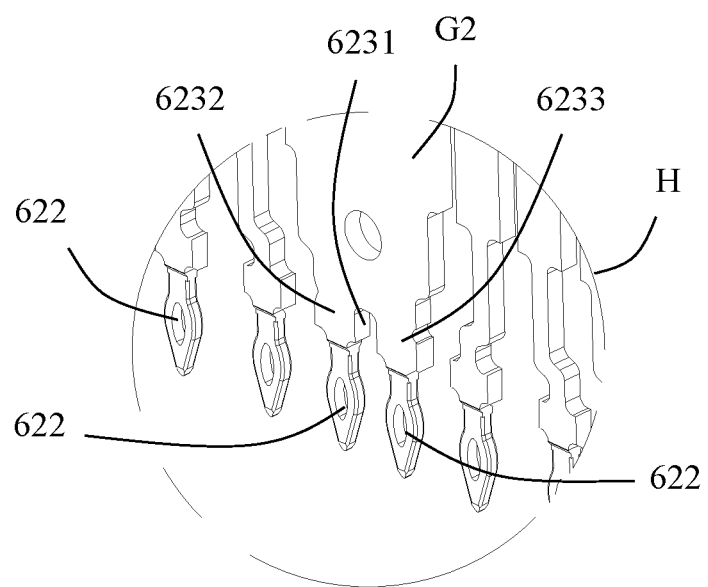
FIG. 15 is a partial enlarged view of a circled part H in FIG. 12.

Each contact portion 621 of the first ground terminal G1 and the second ground terminal G2 is substantially flat. The contact portion 621 of the first ground terminal G1, the contact portion 621 of the second ground terminal G2, and the connection portions 623 of the conductive terminals 62 are all coplanar. As shown in FIG. 15, each connection portion 623 of the first ground terminal G1 and the second ground terminal G2 further includes a slot 6231 adjacent to its corresponding the tail portion 622. The slot 6231 extends through a bottom edge of the connection portion 623, so that the connection portion 623 is divided into a first end portion 6232 and a second end portion 6233. Each of the first end portion 6232 and the second end portion 6233 is connected with one tail portion 622. The contact portion 621 of the first ground terminal G1 and the contact portion 621 of the second ground terminal G2 both extend into the corresponding grooves 6122 to facilitate contact with the first metal shield 63 and the second metal shield 64. The contact portions 621 of the signal terminals S1 extend beyond the protruding block 6121.

Referring to FIG. 14, in the illustrated embodiment of the present disclosure, the contact portion 621 and the connection portion 623 of the first ground terminal G1 both include a first wide surface 621*a* and a first narrow surface 621*b* perpendicular to the first wide surface 621*a*. The contact portion 621 and the connection portion 623 of the second ground terminal G2 both include a second wide surface 621*c* and a second narrow surface 621*d* perpendicular to the second wide surface 621*c*. The connection portions 623 of each pair of differential signal terminals are located between the first narrow surface 621*b* of the first ground terminal G1 and the second narrow surface 621*d* of the second ground terminal G2 which are located on opposite sides of the connection portions 623 of each pair of differential signal terminals.

Referring to FIGS. 10 to 13, each group of wafers 6 further includes an insulating block 65 sleeved on the contact portions 621, and a metal shell 66 sleeved on the insulating block 65. Each insulating block 65 includes two through holes 651 into which the contact portions 621 of the signal terminals S1 are inserted, and a mating surface 652 at an end thereof. In the illustrated embodiment of the present disclosure, the insulating block 65 is substantially cuboid shaped. Correspondingly, the metal shell 66 is substantially cuboid shaped. In an embodiment of the present disclosure, the insulating block 65 is fixed in the metal shell 66, for example, by assembling.

The metal shell 66 includes a first side wall 661, a second side wall 662, a third side wall 663 and a fourth side wall 664. The first side wall 661 is opposite to the third side wall 663. The second side wall 662 is opposite to the fourth side wall 664. An area of the first side wall 661 and the third side wall 663 is larger than an area of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the metal shell 66, so that outer surfaces 6651 of the deflection portions 665 can guide the wafer 6 to be assembled to the header 5, and even guide the metal shell 66 to be inserted into the shielding space 27 of the first backplane connector 100. In addition, in order to better restrict the insulating block 65, the second side wall 662 and the fourth side wall 664 further include restriction protrusions 6621, 6641 formed by stamping the second side wall 662 and the fourth side wall 664 inwardly. The restriction protrusions 6621, 6641 are used to mate with the insulating block 65 so as to prevent the insulating block 65 from being drawn out of the metal shell 66.

Figure 13:
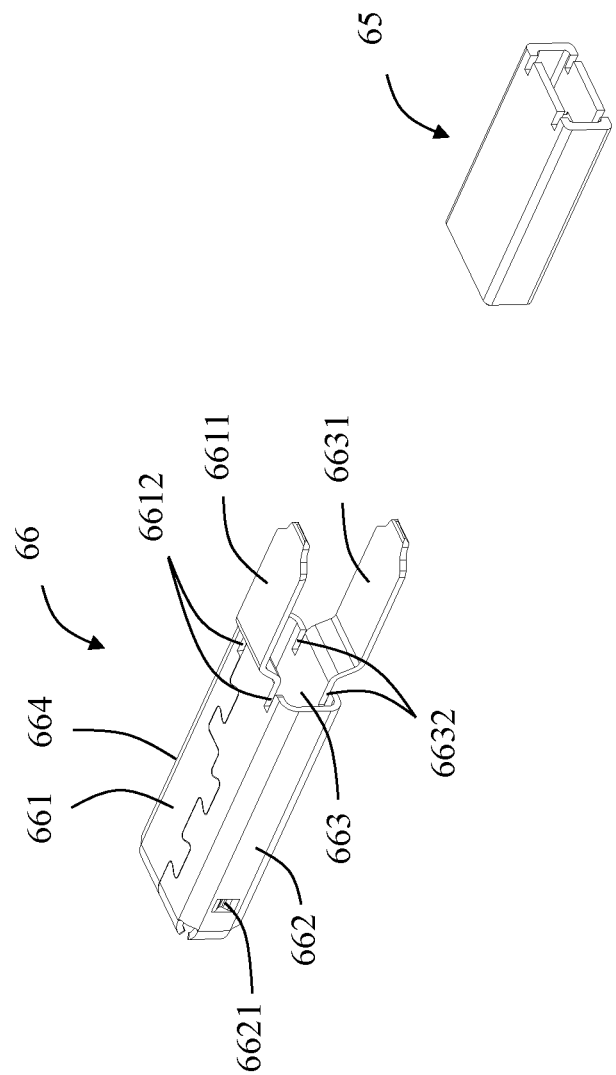
FIG. 13 is a perspective exploded view of an insulating block and a metal shell.

In the illustrated embodiment of the present disclosure, the metal shell 66 further includes a first extension piece 6611 extending from the first side wall 661 and a pair of first slots 6612 located on opposite sides of the first extension piece 6611. The metal shell 66 further includes a second extension piece 6631 extending from the third side wall 663 and a pair of second slots 6632 located on opposite sides of the second extension piece 6631. The first extension piece 6611 is in vertical contact with the contact portion 621 of the first ground terminal G1 so as to improve the shielding effect. The second extension piece 6631 is in vertical contact with the contact portion 621 of the second ground terminal G2 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same metal shell 66 is greater than a distance between the first side wall 661 and the third side wall 663. Referring to FIGS. 13 and 14, for a group of conductive terminals 62 arranged in the manner of G1-S1-S1-G2, the contact portion 621 of the first ground terminal G1 includes a first notch 6216 adjacent to the differential signal terminals. The first notch 6216 is used for receiving the first extension piece 6611. The contact portion 621 of the second ground terminal G2 includes a second notch 6217 adjacent to the differential signal terminals. The second notch 6217 is used for receiving the second extension piece 6631. In the illustrated embodiment of the present disclosure, taking two adjacent pairs of differential signal terminals sharing one second ground terminal G2 as an example, two sides of the second ground terminal G2 respectively include second notches 6217 facing different differential signal terminals, and the second notches 6217 are used for mating with two adjacent metal shells 66.

In the illustrated embodiment of the present disclosure, the first metal shield 63 and the second metal shield 64 are symmetrically disposed on both sides of the insulating frame 61. Referring to FIGS. 36 and 41, the first metal shield 63 includes a first main body portion 631, a first extension portion 632 extending from the first main body portion 631, and a first elastic arm 634 and a second elastic arm 635 which are respectively located on two sides of the first extension portion 632. The first elastic arm 634 and the second elastic arm 635 extend beyond the first main body portion 631 to contact the first ground terminal G1 and the second ground terminal G2, respectively. The first main body portion 631 is located on one side of the connection portion 623 of the conductive terminal 62. In the illustrated embodiment of the present disclosure, the first extension portion 632 and the first main body portion 631 are located in different planes, in which the first extension portion 632 is farther away from the second metal shield 64 than the first main body portion 631. The first main body portion 631 includes a plurality of first mounting holes 6311 for mating with the plurality of first posts 6161. The first posts 6161 are fixed to the first mounting holes 6311 by soldering. The first main body portion 631 includes a plurality of ribs 633. The ribs 633 include a plurality of first ribs 6331 protruding toward the first ground terminal G1 and a plurality of second ribs 6332 protruding toward the second ground terminal G2. The first ribs 6331 are disposed along an extending direction of the connection portion 623 of the first ground terminal G1. The second ribs 6332 are disposed along an extending direction of the connection portion 623 of the second ground terminal G2. In the illustrated embodiment of the present disclosure, the first ribs 6331 and the second ribs 6332 are formed by stamping the first main body portion 631. The first ribs 6331 and the second ribs 6332 protrude toward the second metal shield 64. The first ribs 6331 and the second ribs 6332 are disposed discontinuously along the extending direction of the connection portion 623 of the first ground terminal G1 and the extending direction of the connection portion 623 of the second ground terminal G2, respectively, so as to achieve multi-position contact. Therefore, the reliability of the contact between the first metal shield 63 and the first ground terminals G1 and the second ground terminals G2 is improved. In the illustrated embodiment of the present disclosure, a wall thickness of the first rib 6331, a wall thickness of the second rib 6332, and a wall thickness of a portion of the first main body portion 631 located between the first rib 6331 and the second rib 6332 are the same.

In addition, the first main body portion 631 further includes a plurality of first protruding pieces 6312 extending downwardly from a bottom edge thereof and a plurality of connecting pieces 6313 each of which is located between two adjacent first protruding pieces 6312. By providing the first protruding pieces 6312, the shielding length can be extended, and the shielding effect on the signal terminals S1 can be improved. In the illustrated embodiment of the present disclosure, the connecting pieces 6313 are stamped from the first main body portion 631. The connecting piece 6313 straddles the corresponding slot 6231 to connect one side of the first end portion 6232 and the second end portion 6233 of the same first ground terminal G1, thereby improving the shielding effect. At the same time, the connecting piece 6313 can also connect one side of the first end portion 6232 and the second end portion 6233 of the same second ground terminal G2, thereby improving the shielding effect.

In the illustrated embodiment of the present disclosure, there are multiple first extension portions 632 which are disposed at intervals. The third extensions 632 are used to be inserted into the first slots 6612 and the second slots 6632 of the metal shell 66 to achieve contact and improve the shielding effect.

Figure 6:
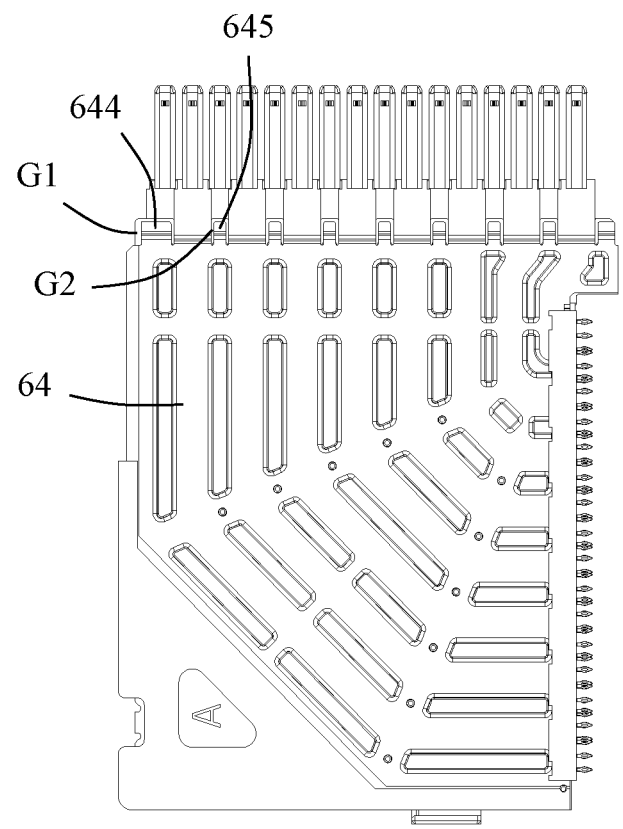
FIG. 6 is a top view of the second backplane connector with a spacer removed therefrom.
Figure 18:
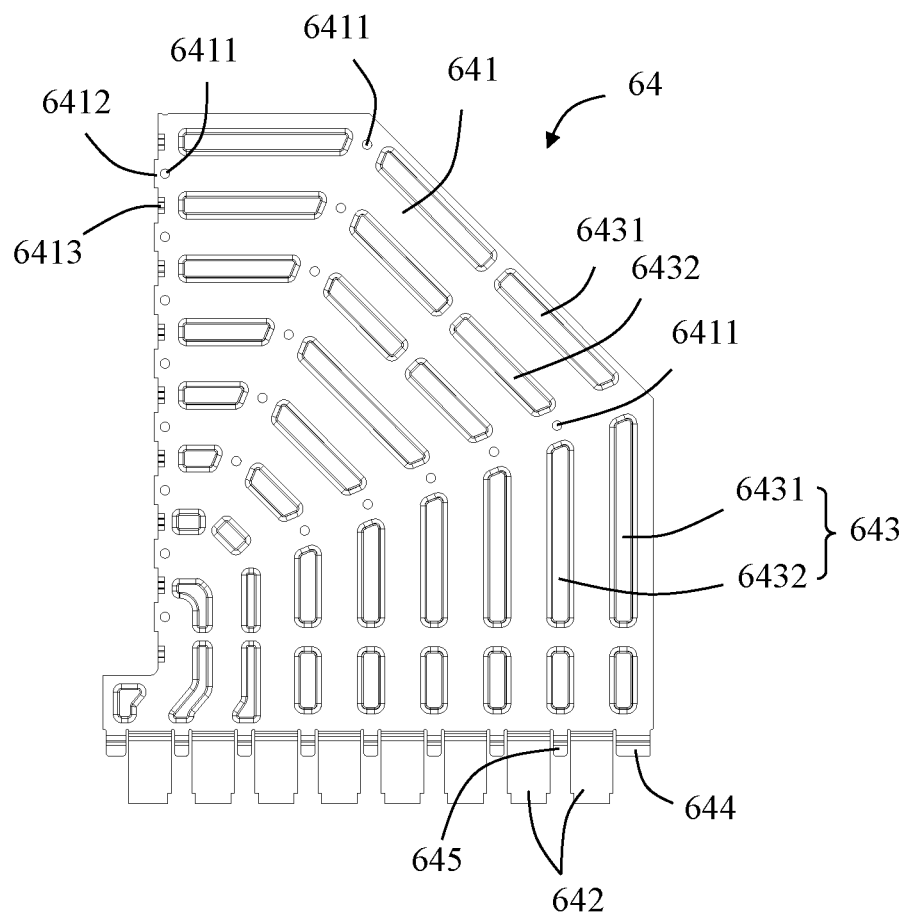
FIG. 18 is a side view of a second metal shield of the second backplane connector.

Similarly, referring to FIGS. 6 and 18, the second metal shield 64 includes a second main body portion 641, a second extension portion 642 extending from the second main body portion 641, and a third elastic arm 644 and a fourth elastic arm 645 which are respectively located on both sides of the second extension portion 642. The third elastic arm 644 and the fourth elastic arm 645 extend beyond the second main body portion 641 to contact the first ground terminal G1 and the second ground terminal G2, respectively. The second main body portion 641 is located on the other side of the connection portion 623 of the conductive terminal 62. In the illustrated embodiment of the present disclosure, the second extension portion 642 and the second main body portion 641 are located in different planes, in which the second extension portion 642 is farther away from the first metal shield 63 than the second main body portion 641. The second main body portion 641 includes a plurality of second mounting holes 6411 for mating with the plurality of second posts 6162. The second posts 6162 are fixed and positioned in the second mounting holes 6411 by soldering. The second main body portion 641 includes a plurality of ribs 643. The ribs 643 include a plurality of third ribs 6431 protruding toward the first ground terminal G1 and a plurality of fourth ribs 6432 protruding toward the second ground terminal G2. The third ribs 6431 are disposed along the extending direction of the connection portion 623 of the first ground terminal G1. The fourth ribs 6432 are disposed along the extending direction of the connection portion 623 of the second ground terminal G2. In the illustrated embodiment of the present disclosure, the third ribs 6431 and the fourth ribs 6432 are formed by stamping the second main body portion 641. The third ribs 6431 and the fourth ribs 6432 protrude toward the first metal shield 63. The third ribs 6431 and the fourth ribs 6432 are disposed discontinuously along the extending direction of the connection portion 623 of the first ground terminal G1 and the extending direction of the connection portion 623 of the second ground terminal G2, respectively, so as to achieve multi-position contact. Therefore, the contact reliability between the second metal shield 64 and the first ground terminals G1 and the second ground terminals G2 is improved. In the illustrated embodiment of the present disclosure, a wall thickness of the third rib 6431, a wall thickness of the fourth rib 6432, and a wall thickness of a portion of the second main body portion 641 located between the third rib 6431 and the fourth rib 6432 are the same. In an embodiment of the present disclosure, soldering is performed on the surfaces of the ribs 633 and the ribs 643 to solder the ribs 633 and the ribs 643 to the first ground terminals G1 and the second ground terminals G2. For example, soldering is performed on the surfaces of the first ribs 6331, the second ribs 6332, the third ribs 6431 and the fourth ribs 6432 so that the first ribs 6331, the second ribs 6332, the third ribs 6431 and the fourth ribs 6432 are soldered to the first ground terminals G1 and the second ground terminals G2. The soldering method is at least one of spot soldering, laser soldering and ultrasonic soldering.

In addition, the second main body portion 641 further includes a plurality of second protruding pieces 6412 extending downwardly from a bottom edge thereof, and a plurality of connecting pieces 6413 each of which is located between two adjacent second protruding pieces 6412. By providing the second protruding pieces 6412, the shielding length can be extended, and the shielding effect on the signal terminals S1 can be improved. In the illustrated embodiment of the present disclosure, the connecting pieces 6413 is stamped from the second main body portion 641. The connecting piece 6413 straddles the corresponding slot 6231 to connect the first end 6232 and the other side of the second end 6233 of the same first ground terminal G1 so as to improve the shielding effect. At the same time, the connecting piece 6413 can also connect the first end portion 6232 and the other side of the second end portion 6233 of the same second ground terminal G2 so as to improve the shielding effect.

In the illustrated embodiment of the present disclosure, there are multiple second extension portions 642 which are disposed at intervals. The fourth extensions 642 are used to be inserted into the first slots 6612 and the second slots 6632 of the metal shell 66 so as to achieve contact and improve the shielding effect.

Figure 20:
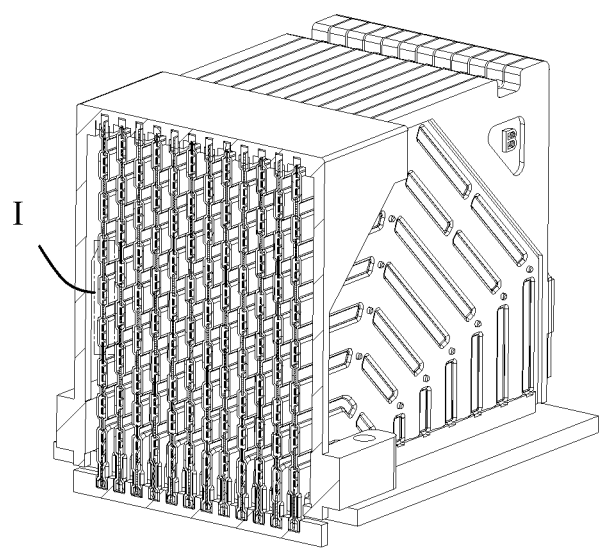
FIG. 20 is a partial perspective cross-sectional view taken along line A'-A' in FIG. 2.
Figure 21:
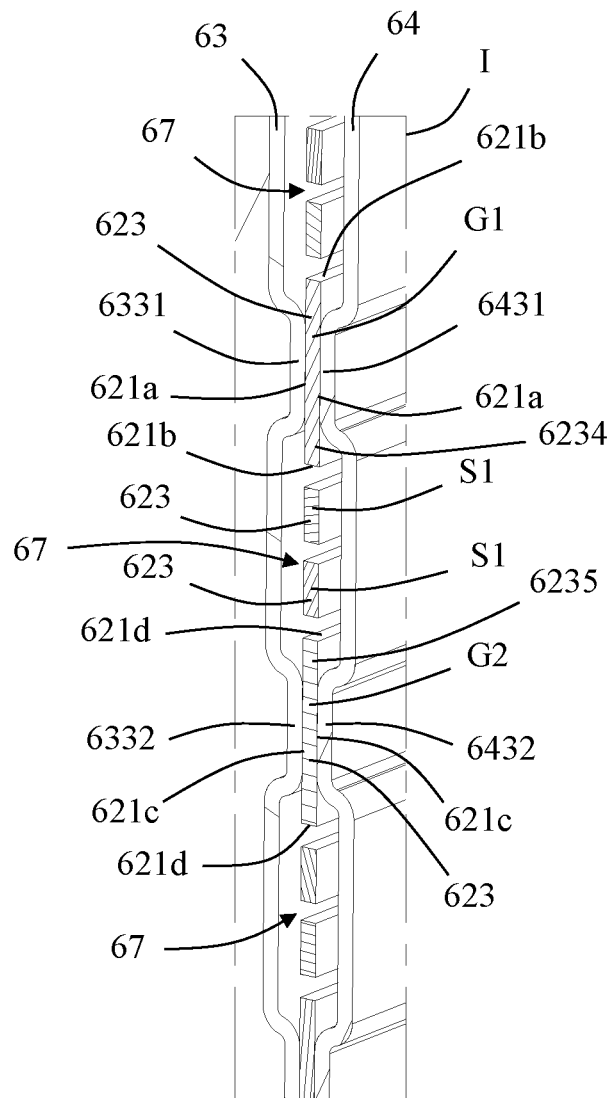
FIG. 21 is a partial enlarged view of a frame part I in FIG. 20.

Referring to FIGS. 20 and 21, in the length of the connection portion 623 of the conductive terminal 62, the first rib 6331 of the first metal shield 63 and the third rib 6431 of the second metal shield 64 are in contact with two opposite side surfaces of the connection portion 623 of the first ground terminal G1, respectively. The second rib 6332 of the first metal shield 63 and the fourth rib 6432 of the second metal shield 64 are in contact with two opposite side surfaces of the connection portion 623 of the second ground terminal G2, respectively. As a result, a shielding cavity 67 surrounding the outer periphery of the connection portion 623 of each pair of differential signal terminals is formed. In the illustrated embodiment of the present disclosure, the first rib 6331 and the third rib 6431 contact the first wide surface 621a of the connection portion 623 of the first ground terminal G1, respectively. The second rib 6332 and the fourth rib 6432 contact the second wide surface 621c of the connection portion 623 of the second ground terminal G2, respectively. In the illustrated embodiment of the present disclosure, the shielding cavity 67 is formed by the first main body portion 631, the second main body portion 641, the first ground terminal G1 and the second ground terminal G2. The connection portion 623 of the first ground terminal G1 includes a third tab portion 6234 extending into the shielding cavity 67. The connection portion 623 of the second ground terminal G2 includes a fourth tab portion 6235 extending into the shielding cavity 67. The connection portions 623 of the differential signal terminals are located between the third tab portion 6234 and the fourth tab portion 6235. In the illustrated embodiment of the present disclosure, there are a plurality of shielding cavities 67 which are disposed along an arrangement direction of each group of the conductive terminals 62. Two adjacent shielding cavities 67 share a single first ground terminal G1 or a single second ground terminal G2. Taking the shared first ground terminal G1 as an example, a part of the shared first ground terminal G1 protrudes into one shielding cavity 67, and another part of the shared first ground terminal G1 protrudes into another shielding cavity 67.

At a position adjacent to the contact portion 621 of the conductive terminal 62, the first extension portion 632 and the second extension portion 642 are both inserted into the first slot 6612 and the second slot 6632 of the metal shell 66. The first extension piece 6611 and the second extension piece 6631 of the metal shell 66 are respectively inserted into the first notch 6216 of the first ground terminal G1 and the second notch 6217 of the second ground terminal G2. At the same time, the first elastic arm 634 of the first metal shield 63 and the third elastic arm 644 of the second metal shield 64 clamp both sides of the contact portion 621 of the first ground terminal G1. The second elastic arm 635 of the first metal shield 63 and the fourth elastic arm 645 of the second metal shield 64 clamp both sides of the contact portion 621 of the second ground terminal G2. Specifically, the first elastic arm 634 and the third elastic arm 644 clamp the first wide surface 621a of the first ground terminal G1. The second elastic arm 635 and the fourth elastic arm 645 clamp the second wide surface 621c of the second ground terminal G2. With this arrangement, the first metal shield 63, the second metal shield 64, the metal shell 66, the first ground terminal G1, and the second ground terminal G2 are all connected in series, thereby the shielding area is increased and the shielding effect is improved.

In the illustrated embodiment of the present disclosure, there are multiple wafers 6 of the second backplane connector 200, and the terminal arrangement of two adjacent wafers 6 are staggered. Correspondingly, the shielding cavities 67 of two adjacent wafers 6 are also staggered. When the wafer 6 is assembled to the header 5, the metal shell 66 of the wafer 6 passes through the corresponding terminal receiving groove 511 so as to extend into the receiving space 535.

Figure 7:
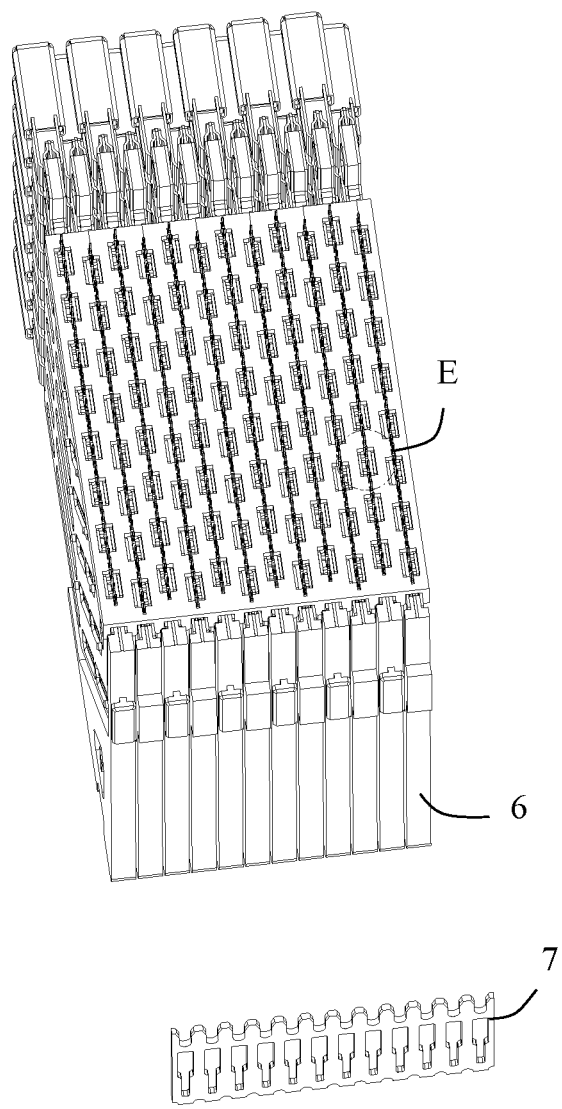
FIG. 7 is a partially exploded perspective view of the second backplane connector with the spacer separated therefrom.
Figure 8:
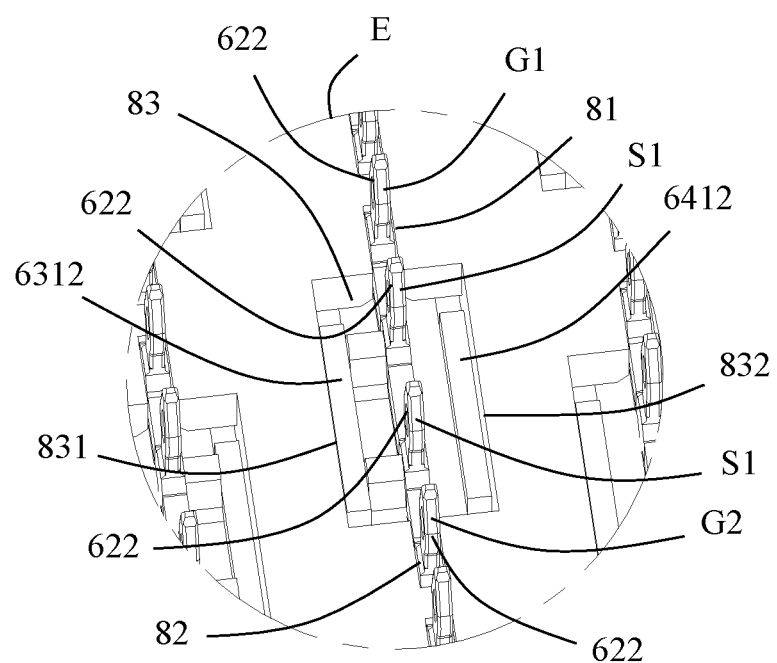
FIG. 8 is a partial enlarged view of a circled part E in FIG. 7.
Figure 9:
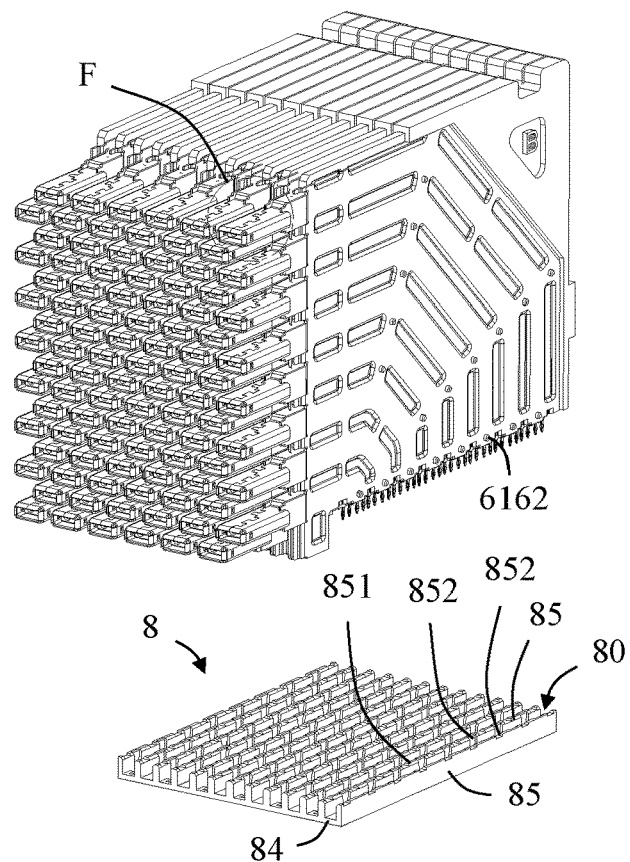
FIG. 9 is a partial perspective exploded view of the second backplane connector, in which a mounting block is separated.
Figure 10:
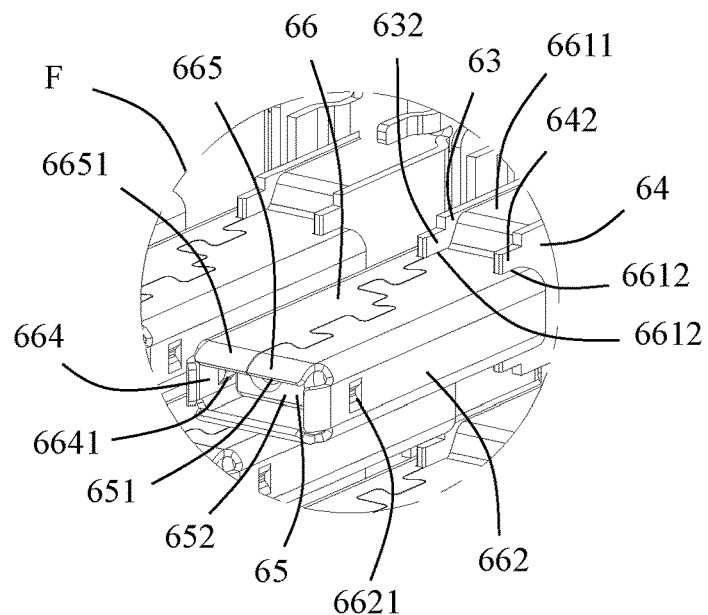
FIG. 10 is a partial enlarged view of a circled part F in FIG. 9.

Referring to FIGS. 7 to 9, the mounting block 8 includes a plurality of first through holes 81 for allowing the tail portions 622 of the first ground terminals G1 to pass through, a plurality of second through holes 82 for allowing the tail portions 622 of the second ground terminals G2 to pass through, and a plurality of slots 83 for allowing the tail portions 622 of the signal terminals S1 to pass through. For a group of conductive terminals 62 arranged in the manner of G1-S1-S1-G2, the first through hole 81 and the second through hole 82 are located on opposite sides of the slot 83 and are in communication with the slot 83. A width of the slot 83 is greater than a width of the first through hole 81 and a width of the second through hole 82, so that the tail portions 622 of the differential signal terminals can be completely exposed in the slot 83. The mounting block 8 further includes a first abutting surface 831 located on one side of the slot 83 and a second abutting surface 832 located on the other side of the slot 83. The first abutting surface 831 and the second abutting surface 832 are disposed opposite to each other. The first protruding piece 6312 of the first metal shield 63 and the second protruding piece 6412 of the second metal shield 64 are at least partially inserted into the slots 83. In the illustrated embodiment of the present disclosure, the first protruding piece 6312 of the first metal shield 63 abuts against the first abutting surface 831. The second protruding piece 6412 of the second metal shield 64 abuts against the second abutting surface 832. Along an arrangement direction of the group of conductive terminals 62 arranged in the manner of G1-S1-S1-G2, the tail portions 622 of the differential signal terminals are located between the tail portion 622 of the first ground terminal G1 and the tail portion 622 of the second ground terminal G2. Along the direction perpendicular to the arrangement direction, the tail portions 622 of the differential signal terminals are located between the first protruding piece 6312 of the first metal shield 63 and the second protruding piece 6412 of the second metal shield 64. This arrangement improves the shielding effect of the differential signal terminals. In an embodiment of the present disclosure, the mounting block 8 is made of electroplated plastic so as to further improve the shielding effect.

Referring to FIG. 9, the mounting block 8 further includes a mounting wall 84 and a plurality of side walls 85 perpendicular to the mounting wall 84. The side walls 85 are spaced apart and parallel to each other, and a plurality of slots 80 for insertion of the wafers 6. Each slot 80 is formed between two adjacent side walls 85. A top of the side wall 85 includes an inclined surface 851 communicating with the slot 80 and acting as an insertion guide. The inclined surfaces 851 of the two side walls 85 located on opposite sides of the slot 80 have different inclination directions so as to form a bell-mouth opening. The bell-mouth opening is used to facilitate the insertion of the wafers 6 or to facilitate to mount the mounting block 8 to the wafers 6. An inner side of the side wall 85 also includes a plurality of positioning grooves 852 communicating with the slot 80 and used for positioning the first posts 6161 and the second posts 6162 which are located on the bottom wall 614 of the insulating frame 61.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector comprising a wafer, the wafer comprising:
    a plurality of conductive terminals, each of the conductive terminals comprising a connection portion and a contact portion;
    an insulating frame fixed with the connection portions of the conductive terminals;
    a first metal shield comprising a first extension portion; and
    a second metal shield comprising a second extension portion;
    wherein the conductive terminals comprise differential signal terminals, a first ground terminal and a second ground terminal, and the differential signal terminals are located between the first ground terminal and the second ground terminal;
    wherein the first metal shield comprises a first elastic arm and a second elastic arm located on opposite sides of the first extension portion, respectively;
    wherein the second metal shield comprises a third elastic arm and a fourth elastic arm located on opposite sides of the second extension portion, respectively;
    wherein the first elastic arm and the third elastic arm are in contact with opposite sides of the contact portion of the first ground terminal; and
    wherein the second elastic arm and the fourth elastic arm are in contact with opposite sides of the contact portion of the second ground terminal.

2. The backplane connector according to claim 1, wherein the connection portions of the differential signal terminals, the connection portion of the first ground terminal, the connection portion of the second ground terminal, the contact portion of the first ground terminal and the contact portion of the second ground terminal are coplanar.

3. The backplane connector according to claim 2, wherein the contact portion of the first ground terminal comprises two first wide surfaces and two first narrow surfaces; the contact portion of the second ground terminal comprises two second wide surfaces and two second narrow surfaces; the first elastic arm and the third elastic arm clamp the first wide surfaces of the first ground terminal; and the second elastic arm and the fourth elastic arm clamp the second wide surfaces of the second ground terminal.

4. The backplane connector according to claim 1, wherein the contact portions of the differential signal terminals extend beyond the first extension portion and the second extension portion; wherein the wafer comprises an insulating block sleeved on the contact portions of the differential signal terminals; and wherein the insulating block comprises two through holes to receive the contact portions of the differential signal terminals.

5. The backplane connector according to claim 4, wherein each contact portion of the differential signal terminals comprises a mating hole to receive a contact portion of a mating conductive terminal.

6. The backplane connector according to claim 5, wherein each contact portion of the differential signal terminals comprises a first contact section, a second contact section, and a slot located between the first contact section and the second contact section, and the slot is in communication with the mating hole.

7. The backplane connector according to claim 4, wherein the wafer comprises a metal shell sleeved on the insulating block, and the metal shell is in contact with the first extension portion and the second extension portion.

8. The backplane connector according to claim 1, wherein the first metal shield comprises a first main body portion connected to the first extension portion, the second metal shield comprises a second main body portion connected to the second extension portion, the first main body portion and the second main body portion are located on opposite sides of the connection portions of the conductive terminals, respectively, the first main body portion comprises a first rib protruding toward the connection portion of the first ground terminal and a second rib protruding toward the connection portion of the second ground terminal, the second main body portion comprises a third rib protruding toward the connection portion of the first ground terminal and a fourth rib protruding toward the connection portion of the second ground terminal; and wherein the first rib and the third rib are in contact with opposite side surfaces of the connection portion of the first ground terminal, respectively; the second rib and the fourth rib are in contact with opposite side surfaces of the connection portion of the second ground terminal, respectively; and the first main body portion, the second main body portion, the first ground terminal and the second ground terminal jointly form a shielding cavity enclosing the connection portions of the differential signal terminals.

9. The backplane connector according to claim 8, wherein the first rib and the second rib are formed by stamping the first main body portion, and wherein the third rib and the fourth rib are formed by stamping the second main body portion.

10. The backplane connector according to claim 8, wherein the conductive terminals comprise multiple pairs of differential signal terminals, each pair of differential signal terminals are located between one first ground terminal and one second ground terminal; and wherein there are a plurality of shielding cavities, and two adjacent shielding cavities share one first ground terminal or one second ground terminal.

\* \* \* \* \*